United States Patent [19]
Casser

[11] Patent Number: 5,945,643
[45] Date of Patent: *Aug. 31, 1999

[54] VIBRATION DAMPENING MATERIAL AND PROCESS

[76] Inventor: Donald J. Casser, 2009 N. Prospect Ave. #24, Milwaukee, Wis. 53202

[ * ] Notice: This patent issued on a continued prosecution application filed under 37 CFR 1.53(d), and is subject to the twenty year patent term provisions of 35 U.S.C. 154(a)(2).

[21] Appl. No.: 08/491,556

[22] Filed: Jun. 16, 1995

[51] Int. Cl.$^6$ ....................................................... E04B 1/82
[52] U.S. Cl. ........................................... 181/290; 181/208
[58] Field of Search ..................................... 181/207, 208, 181/286, 290, 294, 295; 428/215, 414, 423.5, 423.7, 473.5, 494, 518, 77

[56] References Cited

U.S. PATENT DOCUMENTS

| | | | |
|---|---|---|---|
| 3,658,635 | 4/1972 | Eustice | 181/208 |
| 4,681,816 | 7/1987 | Hashimoto et al. | 181/294 X |
| 4,957,797 | 9/1990 | Maeda et al. | 428/77 |
| 5,256,223 | 10/1993 | Alberts et al. | 181/208 |
| 5,368,916 | 11/1994 | Fujimoto et al. | 428/215 |
| 5,473,122 | 12/1995 | Kodiyalam et al. | 181/207 |

*Primary Examiner*—Khanh Dang
*Attorney, Agent, or Firm*—Ryan Kromholz & Manion, S.C.

[57] ABSTRACT

A laminated damping material comprising a layer of high density and high modulus material as a core layer and two layers of higher modulus material being adhered to the core material, the core being sandwiched between the higher modulus layers. The damping material can be further augmented by adhering an additional layer of material exterior to the higher modulus materials if necessary and as needed for the specific application, be it cosmetic, environmental (if resistance to chemical is needed, for example), etc. The damping material can be used for preparing a reinforced composite material which comprises at least one basic multi-layer structure comprising higher modulus material/high modulus panel structure with the layers being bonded with adhesive compatible with both core and outer layer materials and the application where the panel section is used, such as chemical resistance, high heat resistance, etc. If an additional exterior layer is used, the bonding agent must be suitable for that material as well. The resultant structure exhibits extremely high rigidity and vibration damping properties, and may be used as a free standing isolation platform such as a table top, platform or base, for electrical devices, instruments, or any device, object or matter that is affected by external vibration. The materials may alternatively or additionally be used as structural members such as chassis within such devices, instruments, objects or matter, or may be alternatively or additionally utilized as substructures within such instruments, devices, objects or matter. The material may also be used in or in association with acoustical instruments or any other device that is subject to external vibration.

24 Claims, 6 Drawing Sheets

$$Q = \frac{2.71E-4}{8 \times 10^{-5}} = 3.39 \; @ \; 132 \text{ Hz}$$

$$\delta = \left(\frac{1}{32\pi^3}\right)^{1/2} g\left(\frac{Q}{f_n^3}\right)^{1/2} (PSD)^{1/2} \times 2$$

$$\delta = \left(\frac{1}{32\pi^3}\right)^{1/2} 386\left(\frac{3.39}{132^3}\right)^{1/2} (10^{-9})^{1/2} \times 2$$

$$\delta = 9.41 \times 10^{-7}$$

$$Q = \frac{3.2 \times 10^{-4}}{1.7 \times 10^{-5}} = 18.82 \ @ 200 \text{ Hz}$$

$$\delta = \left(\frac{1}{32\pi^3}\right)^{1/2} 386 \left(\frac{18.82}{200^3}\right)^{1/2} (10^{-9})^{1/2} \times 2$$

$$\delta = 1.19 \times 10^{-6}$$

VIBRATION DAMPENING MATERIAL AND PROCESS

BACKGROUND OF THE INVENTION

The present invention relates to structural materials designed to minimize or remove internal or external vibrations which will effect a device, instrument, circuit board mechanism, object, or matter or parts thereof in an undesired manner. Specifically, fibrous reinforcing materials exhibiting high strength and high tensile modulus or other reinforcements with equivalent characteristics or as required internally or externally applied in strands, single, or multiple layers or other forms to a substrate, mass, or core of thermosetting resin, plastic, metal, or other material with high density or high strength or tensile modulus by nature or manufacture. Used in conjunction with devices to separate and additionally isolate a structure from vibrations produced by or through external structures or internal substructures, such material may be used as free standing isolation platforms such as table tops, shelves, or bases for use with existing equipment, instruments, devices, objects or matter sensitive to vibration or may be used as a primary structural member such as a chassis or secondary substructural members such as circuit boards or isolation platforms within such equipment or devices to isolate specific parts or sections thereof. The rigidity and resonance characteristics of the structures can be adapted as required, by altering the selected reinforcing material or materials, the tensile modulus, orientation or thickness or number of layers of the reinforcing material, the modulus characteristics of the resin or bonding agent, the modulus characteristics of the core, the core section thickness, the internal core section reinforcement, the weight of the core via perforations or by using lower specific gravity materials, and other means. A structure adjusted to the application will reduce or dampen the undesired effects of vibration and therefore will improve the resolution, accuracy, and efficiency of devices or objects to which they are applied or in which they are used.

The materials of the present invention have a wide range of application, such as devices or objects used in the creation, recording or reproduction of sound including, but not limited to, devices such as tape or digital recorders, microphones, processors, digital to analogue or analogue to digital converters, amplifiers, preamplifiers, turntables, speakers, etc. The materials may also be used with musical instruments requiring contact with external surfaces for support, such as drums, keyboards, pianos, cellos, etc. The materials may also be used within such instruments or other instruments that do not require external support.

Further, the materials may be used within or in conjunction with devices including, but not limited to, medical instruments and devices, power supplies, computers, scientific instruments, measuring devices, lasers, optical devices, precision control devices, optical devices, satellites, or any electrical, acoustical, optical, mechanical or any other object, device or matter that may be effected by internal or external vibrations in an undesired manner.

The prior art known to the inventor has to date consisted of three primary approaches to dealing with vibration problems: the application of viscoelastic polymers either alone or in a constrained layer format, laminations primarily consisting of lightweight or honeycomb core materials with high modulus skins, or mass loaded platforms such as granite, marble, concrete, or lead. These approaches may be effective to some degree or for specific vibrational frequencies, but each has its own limitations.

Viscoelastic or constrained layer polymers applied to an existing structure are by definition attempting to minimize the negative effects of vibration after they already exist within the component or device, instead of preventing or precluding them from entering the device at the outset. A laminated section with a lightweight core material may be rigid but may well lack sufficient mass and internal damping characteristics. One means to compensate for these inherent characteristics is to create core sections of formed metal or similar materials that are of great thickness (typically two or more inches) possibly incorporating internal dampening mechanisms and to laminate such a core section with high tensile modulus surface materials. These are frequently bulky, quite expensive and impractical for incorporation within components and devices. Granite, marble, concrete or structures of similar materials have the necessary mass but lack the necessary rigidity and internal dampening characteristics to itself be highly resistant to resonance and vibration, nor do they typically have electrical shielding properties. In an attempt to compensate for this inadequacy, large sections of the material are used resulting in large, heavy sections which are also expensive and in many situations impractical. In addition, devices to decouple platforms or components from external substructures have generally been limited to viscoelastic polymers or other damping materials having large contact areas with external surfaces, cones or feet made of non-reinforced plastic, metal, or cast resin materials, or elaborate dampening devices that are costly to execute. It has been desired to develop damping materials and structures that are more effective in performance with wide ranging applications, versatile in size and weight, practical to use, practical to fabricate, and cost effective to produce. It was with this background the development of the present invention took place.

The prior art with regard to chassis or structures for components or devices has consisted primarily of formed sheet steel, aluminum, other metals, or non-reinforced plastic (typically injection molded). All are highly susceptible to resonance, and are frequently treated with viscoelastic polymers in an attempt to counteract their inherent flaws. There is an occasional piece that incorporates a high density material such as granite or non-reinforced thermoset resin as an improved, but not ideal, structure.

Circuit boards are conventionally fiberglass structures that fail to take advantage of higher modulus reinforcing materials, nor are they designed with the intent of producing an inherently damped structure or material.

The goal of the present invention is to develop a system of structural and/or methodological alternatives to the solutions for vibration problems which are currently available. The materials need to have merit in a wide variety of applications, including as primary structures, substructures, application in harsh environments, etc. A further goal is for the materials to be able to accommodate the potential of large scale production or fabrication at a reasonable cost, and the capability of incorporating threaded inserts, bolt holes, and the like for practical use as component chassis, circuit boards, etc. As a result of these rather unusual demands, the development of structures using high modulus reinforcements in addition to or in conjunction with of high density materials that could meet the practical demands of manufacture and fabrication was undertaken by the present inventor.

While not limiting myself to any particular theory, I believe that structures described and disclosed in the present invention derive their performance characteristics essentially by enhancing the performance characteristics of higher density materials that are inherently less prone to vibrational effects, possess high rates of internal dampening, and by using high tensile modulus materials appropriate to the application as additional reinforcement internally or externally as a constraining layer. The effects of this additional reinforcement or constraining layer may be varied as desired by adjusting the quantity or tensile modulus of the reinforcement or reinforcing layer. These affects may be further augmented by adding layers of similar or dissimilar materials thereon, and can be further adjusted by the shear strength, elongation fillers, and other characteristics of the resin or bonding agent employed or by the use of additional fillers. The overall structure can be fully optimized to the specific application by incorporating electrical shielding, high heat resistance, chemical resistance, etc. as required by means of external lamination, modifications to the resin or bonding agent, core material, etc.

DEFINITIONS OF TERMS

For the purposes of clarity the terms given below shall be interpreted throughout the specification and the claims as having the following definitions. Should there be any contradiction between the meaning given a term herein and its common meaning that term shall be interpreted as having both meanings.

High Modulus Reinforcing Material—(1) Any fibers in any form including woven or nonwoven materials or webs of woven or nonwoven material including, but not limited to, carbon fiber, fiberglass, aramids, aramid fibrous, metal strips or shavings, plastics, and other materials exhibiting characteristics including high and/or tensile modulus. Other examples may include silicon carbide fiber, alumina fiber, highly orientated polyethylene fiber, quartz fibers, ceramic fibers, etc. (2) A material like carbon fiber commonly used in the marine and aviation industry, e.g., G104 Plainweave sold by Textile Technologies Industries, Inc. of 2800 Turnpike Drive, Hatboro, Pa. 19040 (215) 443-5325, materials made from aramid fibers such as KEVLAR brand materials, or SPECTRA brand materials. (3) Any material having characteristics equivalent to the aforementioned materials.

Resin—(1) A material having the characteristics of a polyester or an epoxy. For example, REICHHOLD POLYLITE polyester number 33-247 made by Reichhold Chemicals, Inc., Reactive Polymers Division, in Durham, N.C. 27713 (919) 544-9225 or APC W081993-6 epoxy from Advanced Polymer Concepts of W186 N1167 Morse Drive, Germantown, Wis. 53022 (414) 253-5900. (2) Any material having characteristics equivalent to the aforementioned materials, e.g., phenol resins, diallylphthalate resins, polymide resins, cyanate resins, etc.

Catalyst—(1) A material used for curing the resin in a desired time frame and at a desired temperature. For example the epoxy from Advanced Polymer Concepts comes with a catalyst, the manufacture identification number, APC W081993-6, identifies a particular catalyst resin system, which causes initial curing, after mixing the resin and the catalyst in a 2:1 ration, of the resin in 10–12 hours at standard temperature and pressure and results in a resin material that can withstand elevated temperatures and has good dielectric properties. The POLYLITE polyester 33-247 requires the addition of a catalyst, namely Organic Peroxide Type D, Liquid UN 3105 available from Cook Composites and Polymers, 217 Freeman Drive, P.O. Box 996, Port Washington, Wis. 53074, which causes curing of the resin in approximately 2 hours at standard temperature and pressure when the polyester and the resin are mixed in 99:1 ratio. (2) The type of catalyst used and the amount of catalyst used depend upon the type of resin system chosen and the performance characteristic desired. Usually, the manufacturer of the resins can recommend a suitable catalyst depending upon the specific application.

Cover Material—(1) Materials including metals, plastics, protective or reinforcing material, and/or resins; e.g., acrylic resins formed by the polymerization of the monomeric derivatives, generally esters or amides, or acrylic acid or α-methylacrylic acid. They are transparent, water-white, and thermoplastic; resistant to age, light, weak acids, alkalis, alcohols, alkanes, and fatty oils. (2) 0.118 inch plexiglas MC from ATO HAAS North America, Inc. of Independence Mall West, Philadelphia, Pa. 19105 (203) 828-3593. (3) Any material that may be reasonably substituted or which has equivalent characteristics. Such materials may be chosen for a variety of reasons and, depending upon the reason chosen, may enhance, reduce, or have no effect at all upon the vibrational dampening characteristics of the present invention.

Core material—(1) A material like bulk molding compound M-103 available from Industrial Dielectrics, Inc., P.O. Box 357, Noblesville, Ind. 46060 (317) 773-1766. (2) A material like 0.5 inch fiberglass board sold under the name APO-3 Black by Nohl Electrical Products Corp. 5901 W. Bender Court, Milwaukee, Wis. 53218 (414) 464-8480. (3) Reinforced composite materials using reinforcing materials including high strength and high modulus materials like carbon fiber, aramid fiber, glass fiber, alumina fiber, quartz fiber, silicon carbide fiber, and highly orientated polyethylene fiber or other materials. (4) Metal plates, ceramic material, glass plates, plastic, stone (Granite), etc. (5) Any material which may be substituted for the above noted material.

Fillers—(1) Materials including rubbery or resinous substances such as nitrile rubber, polyvinyl chloride resin, polyvinylidene chloride resin, acrylic rubber, silicone rubber, and/or chlorohydrin rubber. (2) Powdery substances such as silica, alumina, talc, calcium carbonate, mica, clay, carbon black, graphite, calcum silicate, titanium oxide, aluminum hydroxide and/or barite. (3) Materials having characteristics equivalent to the above noted materials.

SUMMARY OF THE INVENTION

The materials, structures, and processes of the present invention can be achieved in primarily the following ways:

1. If a solid composite material having internal reinforcement with no exterior laminations is desired to form structures like support cones, platform legs, or even circuit boards or other structures or substructures, the resin material may be combined with stranded, matted, shredded, or particlized, or other forms of reinforcement materials of high tensile strength and modulus. Fillers may also be added to the resin to give the desired degree of elasticity, density, shielding and other desired characteristics to form a resulting resin matrix.

These resins may include, but are not limited to, polyesters, epoxies, urethanes, phenolics, and others having adequate physical characteristics for specific application, such as heat resistance, chemical resistance, surface hardness, etc.

This composite material may be made by adding the high modulus reinforcing material to a casted, poured, or molded resin matrix, orienting the fibers of the high modulus reinforcing material as needed for the application. The material can also be made by using resin transfer molding or a similar technique, whereby the high modulus reinforcing material is laid, as required for the application, dry into a tool of the desired form, and the resin, including any desired fillers, is injected under pressure to saturate said high modulus reinforcing material. Such a tool may incorporate heating elements, accelerating the cure of the resin matrix and raising the glass transition point to the desired level if necessary. This method may also utilize thermosetting resins, Bulk Molding Compounds (BMC's) or Sheet Molding Compounds (SMC's) that have the appropriate reinforcement content and other additives to the resin matrix as needed, and formed using conventional compression, injection or other molding techniques. This system has the advantage of low cost per part price once the investment in tooling has been made. It also uses a higher cure temperature that will ensure a sufficiently high glass transition temperature for high heat applications. Structures manufactured in the above manners may incorporate additional reinforcement or thickness, such as ribbing, as needed or desired to achieve the intended results.

Reinforcements suggested for use in this method include but should not be limited to carbon fiber, fiberglass, aramids, metal strips or shavings, plastics, or other materials exhibiting the same or similar characteristics such as high flexural and tensile modulus or other characteristics as desired. Additives or fillers may also be used to achieve the desired dampening characteristics and include, but are not limited to, calcium carbonate, aluminum trihydrite, graphite, powdered metals, microspheres, or other materials as needed to provide the density, tensile modulus, and modulus of elasticity required, or other desired characteristics including electrical shielding, heat resistance, fire resistance, chemical resistance, etc. Members constructed in this fashion can include features molded into the section including threaded inserts, protrusions designed to interact with internal or external structural members in a manner transmitting vibration in the desired fashion.

Panels made of the material of the present invention should have a section thickness from 0.400" to 5", with the preferred section being 0.625" thick for uses as shelves, freestanding platforms or chassis for devices to approximately 125 pounds. The section thickness may be adjusted for the weight of the device it will be used in conjunction with and the specific application.

2. The present invention may also be executed by using a core material similar in nature to the material described above laminated with a single layer of reinforcing material of high strength, high tensile, or high flexural modulus on one or both sides of the core material using resins or adhesives compatible with the reinforcing material and the aforesaid core material resulting in a laminate section. In effect, the laminations to the core material may be acting in the manner of a constraining layer to an already high modulus material. Combined with resins or adhesives exhibiting the desired shear, strength and elastic modulus characteristics, the resultant laminate section or composite material provides very high damping characteristics along with high rigidity and density characteristics and therefore is inherently resistant to a vibration or the transmission thereof.

The preferred embodiment of the present invention is a core material of thermoset resin including but not limited to such resins as epoxy or polyester which may include reinforcements including, but not limited to, woven or nonwoven fibrous materials such as carbon fiber, aramid fibers, polyester fibers, or others as desired, fiberglass or non-woven materials such as metal, plastics or other high tensile modulus reinforcing materials laminated with additional reinforcing material such as carbon fiber, fiberglass, Kevlar or other high tensile modulus fibrous materials using resin systems, including, but not limited to, epoxy resins, unsaturated polyester resins or others as described in the Definition of Terms. These materials are applied to and saturate the cloth or fiber reinforcement allowing bonding of said reinforcement to the core material. The laminate may alternately consist of similarly high modulus materials of nonwoven nature such as metals, plastics or other materials exhibiting high tensile strength or modulus characteristics. Adhesives or bonding agents for these alternate materials may include epoxies, polyesters, urethanes, cyanoacrylates, isocyanates, phenolics or other resins or bonding agents compatible with the core and laminate materials and exhibiting the desired physical characteristics. The rigidity and damping characteristics of the present invention maybe adjusted by varying the density of the core material, the tensile modulus, flexural modulus, modulus of elasticity and other such characteristics of the core material like the thickness of the core material, also the thickness, tensile modulus and orientation of fibrous reinforcements of the surface laminate or laminates (if used) or the thickness or tensile modulus of other surface laminations as may be utilized such as in sheet form, and by the modulus of elasticity, flexural modulus, shear strength and other characteristics of the resin or bonding agent may all be adjusted depending upon the ultimate use of the material.

Should it be desired to increase the stiffness or rigidity of the present invention weight be of significant consideration, the high density core material can be perforated to varying degrees at regular or irregular intervals thereby increasing the strength to weight ratio. In this event, care should be taken not to significantly fill the perforations in the core material with the bonding agent, or the weight savings will be minimized. A perforated core material will require the use of an inherently stiff surface laminate, such as metal, plastics, or other similar materials, otherwise significant distortions of the surface materials may result. Such surface distortions can be minimized by using small perforations of regular or irregular shape frequently throughout the core section, rather than larger but less frequent perforations. The execution of a laminated panel using a perforated core material is discussed at length in U.S. Pat. No. 3,649,430, and will not be repeated in this application.

The surface of the core material should be properly prepared for bonding including, but not limited to, such means as surface abrasion, acid or chemical treatment, sand blasting, plasma treatment, corona discharge treatment, conditions thereof or other treatment application to the material and bonding agents used. The surface of the reinforcement material to be applied to the core section should also be properly prepared as necessary and in a manner appropriate to the bonding means and agent.

A laminate of this configuration can be constructed by the following means, among others:

a. For lower volume production or custom pieces, a molding surface such as glass, plastic sheet, plastic laminate, or other similar or appropriate material with the desired surface texture and properly prepared with suitable release agent (if necessary) is coated with the resin or bonding agent suitable for the reinforcement material. Such resin or agent should be in sufficient volume to fully impregnate or saturate the reinforcement material and allow for adequate bonding to the core material. The desired high modulus reinforcement material such as carbon fiber, fiberglass, Kevlar or other fibrous material as listed in the Definition of Terms of high tensile modulus of slightly larger dimension than the desired finished panel is then placed in the resin matrix and saturated with the resin, any bubbles are agitated or worked out of the material by conventional means such as rollers, with sufficient resin to ensure a proper bond to the core material available on the exposed surface of the carbon fiber or other high modulus reinforcement material utilized. A piece of the core section precut to the desired size and of slightly smaller dimensions than the reinforcement material, also coated with the suitable resin or bonding agent, is then placed directly on top of the impregnated carbon fiber or other fibrous reinforcement and compressed, using suitable pressure as needed to ensure proper bond. If desired, a similarly prepared resin and reinforcement combination may be placed on the exposed core section, coated with the resin or bonding agent, prior to compression, resulting in a balanced panel laminate in a single assembly process. The assembly may be heated in an even fashion using heated plates, ovens or other means to accelerate cure and raise the glass transition point of the resultant laminate section.

When the resin or bonding agent is suitably cured, the laminate is removed from the molding surface and the reinforcement material trimmed to the edge of the core material by the use of a knife, router, or other means. The excess resin or bonding agent is then cleaned or removed from the exposed edge of the core material. The aforesaid core material, being by nature a material of high density and therefore conducive to polishing, is finished as desired. If a properly prepared molding surface is used and the appropriate resin selected, no further finishing of the laminate surface should be necessary.

b. A section of similar nature can be executed in larger scale by laminating entire sheets of the core material with the desired reinforcement material in large presses, then cutting the panel to the sizes desired. A number of sheets can be laminated at one time, provided the resin or bonding agent has sufficient open working time and suitable release material is placed between each multi-layer laminate assembly.

c. A laminate as described above may also be produce by means oriented for large scale production. Large sheets of core material may be laminated with reinforcing materials by a continuous means or mechanism such as roller presses, whereby reinforcing material are impregnated with resin or other bonding agents and compressed to the surface of the core as said material passes through a roller system. Often heat or preimpregnated or precoated reinforcement are utilized in this type of system.

Alternatively, the material of the present invention may also be produced by using woven or nonwoven high modulus reinforcements along with conventional reinforcements in compression molding equipment as designed for sheet goods, formed section, etc. In this approach, the high modulus reinforcement material would be placed on the exterior of lesser grade reinforcement materials in one or more layers in parallel with the large planar surfaces of the panel or form, possibly covered by a surface veil or equivalent material for surface quality and thorough resin penetration. Special features or material may be incorporated as needed, such as conductive layers, heat shielding, etc. A thermoset resin mixture containing any desired fillers and of the appropriate viscosity for adequate penetration of the reinforcement material is interspersed between the reinforcement layers as they are laid in the press, and high pressure and heat are then applied to effect cure. The sheet or forms can then be cut, machined, or undergo other secondary operations as desired. Additional methods such as poltrusion may be employed, whereby selected reinforcements are impregnated with resin and fed through a tool, also using heat and pressure to form the desire part. Other methods may be adapted or employed to construct the materials of the present invention.

d. Reinforcements preimpregnated with resin or bonding agent may also be used, compressed with conventional vacuum bag techniques and placed in an autoclave for accelerated cure or by other similar means. The reinforcements may then subsequently be applied to the core material.

3. The present invention may additionally be executed as described in (2) above with the addition of one or more additional laminations to one or more surfaces of the core material, providing additional damping characteristics and cosmetic or other surface characteristics as required such as heat resistance, chemical resistance or other characteristics as desired for the application. As an example of the above, the carbon fiber or other fibrous reinforcement may be laminated between the core material and a sheet of acrylic using polyester resins compatible to the core material and the acrylic sheet. If the acrylic is laminated to both large planer surfaces of the core material, the multiple layer laminate will have a cross section of acrylic/carbon fiber in polyester resin matrix/core material/carbon fiber in polyester matrix/acrylic. This particular lamination displays additional rigidity and damping characteristics over the lamination described in section (2), with the added benefit of a pleasing cosmetic appearance. Again it is necessary to use resins or bonding agents compatible with all of the materials used and with the physical characteristics desired.

The material used for the exterior surface lamination may be selected for the desired characteristics required for the application. For example, it may be desired to use stainless steel or other metal or nonwoven materials in applications where the panel may be exposed to chemicals, high wear, etc. Another example may be the use of metals or high heat films when the laminate will be utilized in high temperature applications. As above, the core material, reinforcements, surface materials and resins or bonding agents must be compatible with each other and the environment in which it will be used, such as exposure to chemicals, heat or temperature extremes, etc.

The multiple layer lamination panel may be further augmented by additional laminations of reinforcing materials, heat resistant films, or other materials as desired for the application, resulting in a panel with two or more laminations on one or more of the planer surfaces of the core material. As previously discussed, the characteristics of the panel may be additionally affected as desired by using reinforced core sections, core sections of increased thickness, a perforated core section, etc.

These and other benefits of the present invention will be apparent to one skilled in the art from the following description.

DETAILED DESCRIPTION

Although the disclosure hereof is detailed and exact to enable those skilled in the art to practice the invention, the physical embodiments herein disclosed merely exemplify the invention which may be embodied in other specific structure. While the preferred embodiment has been described, the details may be changed without departing from the invention, which is defined by the claims.

Figure 1:
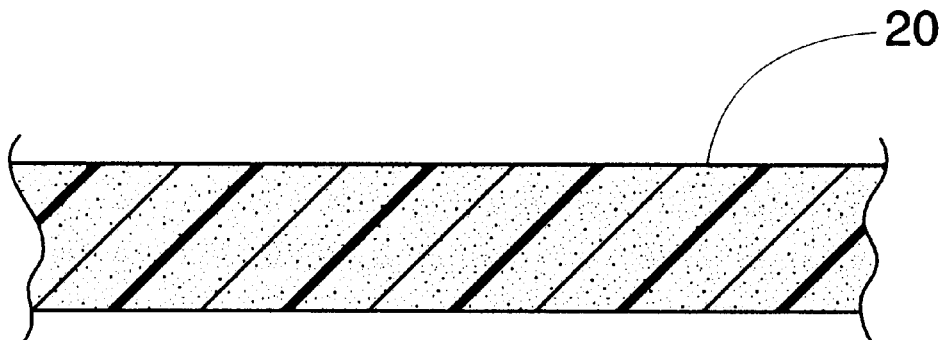
FIG. 1 is a cut away side view showing the core section material.
Figure 2:
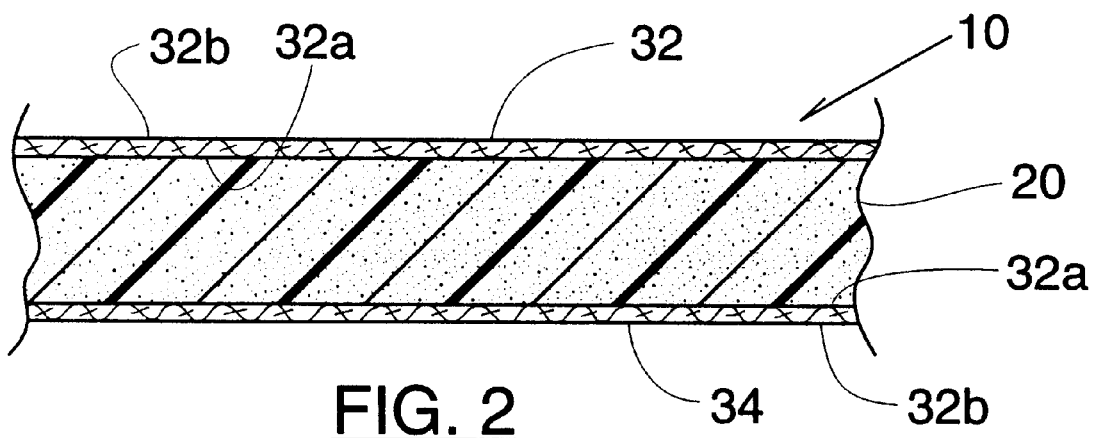
FIG. 2 is a cutaway side view showing the high modulus material as described in the Definition of Terms fastened to the surface of the core material thereby illustrating that the core material is essentially sandwiched between two layers of the high modulus material.
Figure 3:
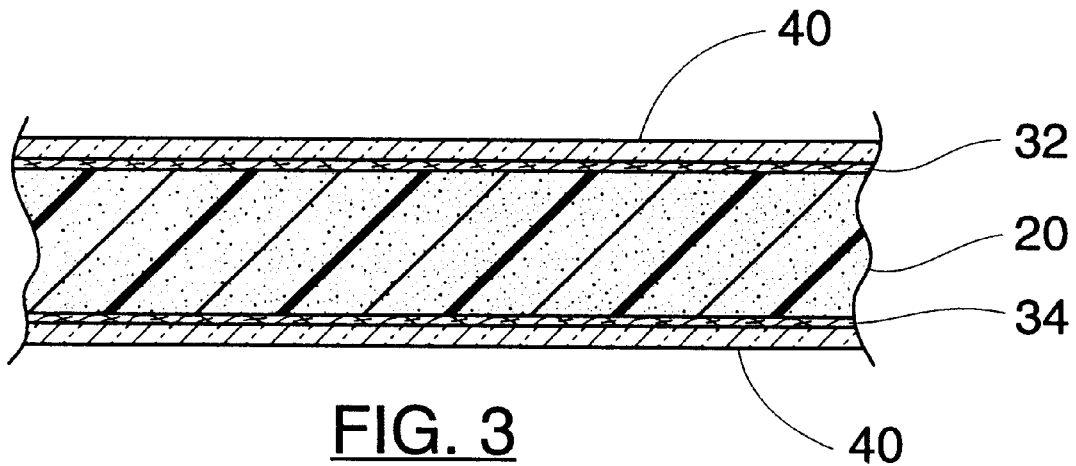
FIG. 3 is a cutaway side view showing the high modulus material and core material sandwiched between two additional layers of material; acrylic in this example.
Figure 2A:
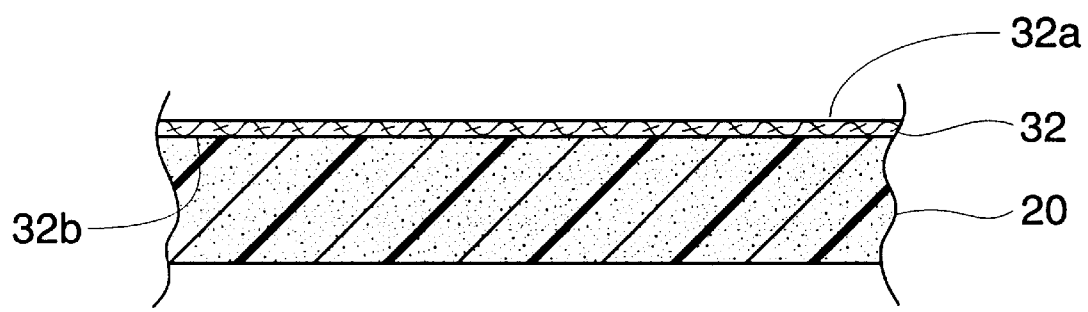
FIG. 2A is a cutaway side view of the present invention showing the high modulus material applied as a single layer to the core material.

The present invention is a vibration dampening material 10. Referring to FIGS. 1–3 the material 10 of the present invention can be seen to be generally composed of core material 20 made of 0.5 inch fiberglass board sold under the name APO-3 Black by Nohl Electrical Products Corp. 5901 W. Bender Court, Milwaukee, Wis. 53218 (FIG. 1), two layers, 32 and 34, of a high modulus material 30 made of G104 Plainweave carbon fiber sold by Textile Technologies Industries, Inc. of 2800 Turnpike Drive, Hatboro, Pa. to which a resin/catalyst mixture APC W081993-6 from Advanced Polymer Concepts (FIGS. 2 and 2a).

Referring to FIG. 3 an optional cover layer 40 may be seen. This layer may be made of acrylic material comprising 0.118 inch plexiglas MC from ATO HAAS North America, Inc. If the optional cover layer 40 is acrylic it is preferred that the resin applied to the high modulus material 30 be POLYLITE polyester 33-247 which requires the addition of a catalyst, namely Organic Peroxide Type D, Liquid UN 3105; The ratio of POLYLITE polyester 33-247 to the catalyst being 99:1.

In manufacturing the vibration dampening material 10 it is preferred that each layer, 32 and 34, of the high modulus layer 30 have a resin applied to it by brushing the resin onto a working surface having a desired texture. This is preferably done by applying the desired resin to the working in sufficient quantity to saturate the material 30. The working surface should be a surface to which the resin material will not stick and it may necessary to treat the surface with a standard mold release compound like wax. A roller or other tool is used to work the material 30 into the resin and aid in saturation and impregnation of the material 30. Once the material 30 has been saturated the core material 20 is applied to the exposed surface 32a and the resin is allowed to cure, the epoxy resin/catalyst used taking approximately 10–12 hours to cure. The resulting vibration dampening board 10 being removed for use as is or to have another layer of material 30 applied to its opposite side 32b. Excess material 30 and resin should trimmed or removed to present a neat appearance.

Alternatively, if a vibration dampening board 10 having a cover material 40 is desired, the material 30 is laid on the cover material 40 and the appropriate resin, e.g. the POLYLITE polyester resin, is applied. A roller or other tool is then used to force out any air that may be trapped between the cover material 40 and the material 30. After using the roller the core material 20 is placed onto the exposed side of the material 30 and the resin allowed to cure. This takes approximately two hours. The same process is repeated if it is desired to cover the opposite side of the core material 20 that is used.

Once the vibration dampening material 10 has been constructed it may be used for any of the purposes previously noted. For example, the material 10 may be used as a platform, a baseplate, a box, parts of a box, as part of an internal component like a circuit board (if a circuit board is made or any other structure that would be in contact with a source of electric current then the material 30 should be made from a material with good insulating qualities like an aramid fiber), a mounting plate, or similar structures for use with electrical components, instruments, lasers, or other devices that could be adversely affected by unwanted vibration. A platform composed of the material 10 will allow a component or device to operate or exist with minimal effect from undesired vibration.

It should be understood that vibrations develop and effect all types of components, not just audio components. This is particularly bothersome in components such as instruments in laboratories where vibrations can affect test results by poor resolution or increased error rates; and in stereo equipment where vibrations can adversely affect the purity of the sound produced or recorded. Vibrations develop into all sorts of resonances—and it is predictable that resonances will find responses and propagate. In audio and video applications these resonances will be amplified and feed unwanted information and distortion back into the system or the original information will be lost or obscured. By virtue of its vibrational dampening characteristics a platform, made of the material 10, upon which a stereo component is placed, e.g., a CD player or an amplifier, will create an essentially sonicly neutral platform. Further, a platform made of the material 10 will also have the added advantage of providing RFI/EMI shielding, should it be desired.

Figure 4:
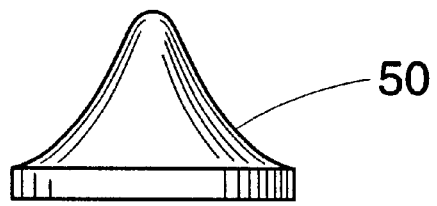
FIG. 4 is a side elevational view showing a vibration dampening cone made from the core material.
Figure 5:
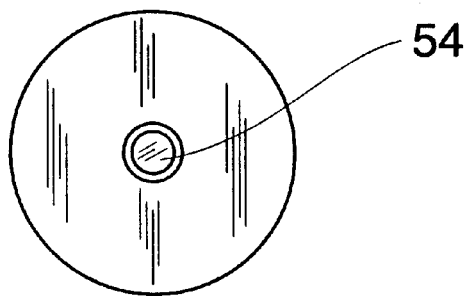
FIG. 5 is a bottom plan view showing a vibration dampening cone made from the core material having an opening for receiving a fastener.
Figure 6:
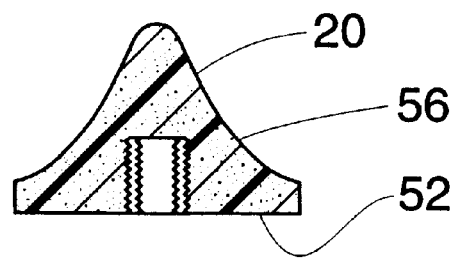
FIG. 6 is a cutaway side elevational view showing a vibration dampening cone made from the core material and the opening for receiving a fastener.
Figure 7:
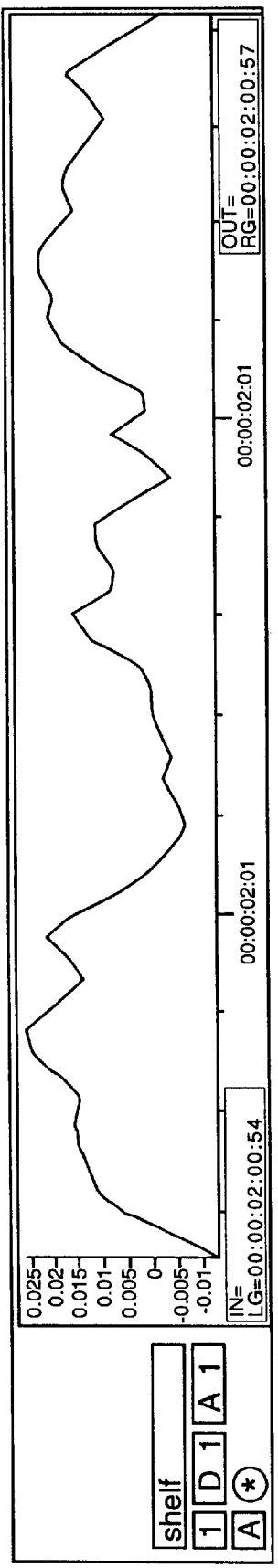
FIG. 7 is an illustration of a waveform of music played on a stereo component using a platform made of the sound dampening material.
Figure 8:
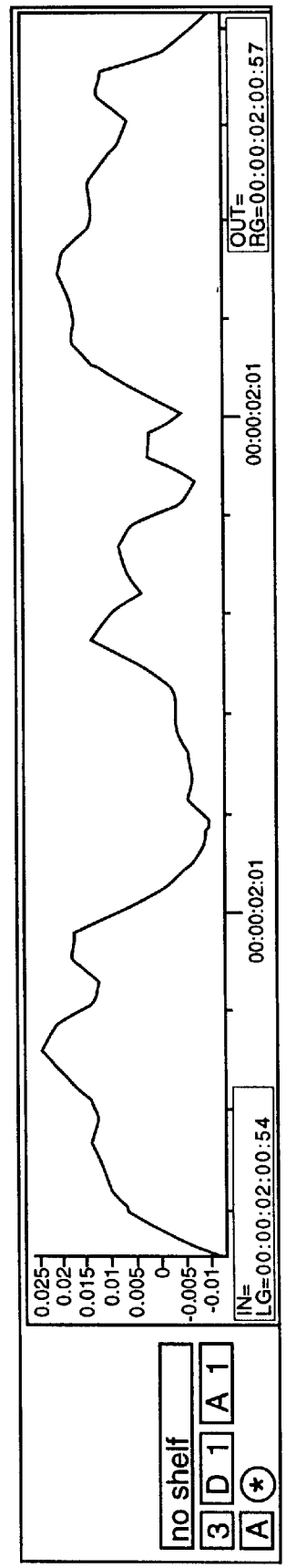
FIG. 8 is an illustration of a waveform of music played on a stereo component not using a platform made of the sound dampening material.

Referring to FIGS. 7 and 8 the differences between using a component with and without a platform made of the material 10 may be illustrated. FIGS. 7 and 8 disclose two waveforms of the exact same piece of music which was mixed from multitrack to digital audio tape or (DAT). The mixes were run to two identical DAT machines: one with a platform made from the material 10 (and using the cones 50 disclosed in FIGS. 4–6) under it and one without a platform made from the material 10 under it. FIGS. 7 and 8 illustrate a comparison of just $2.2676 \times 10^{-5}$ seconds. The editing software used in this test is Sonic Solutions, which is well known in the professional audio world as the standard for audio editing.

Referring now to FIGS. 7 and 8 it may be seen that the waveform of FIG. 8, the one without the platform made from the material 10 looks as if the peaks of transients have been distorted or cut off. In other places it looks as if there are resonations in the non platform waveform that are absent in the platform waveform. This changes can be heard by a listener in the improved sound produced from a stereo system using even one component that rests upon a platform made of the material 10.

Figure 9:
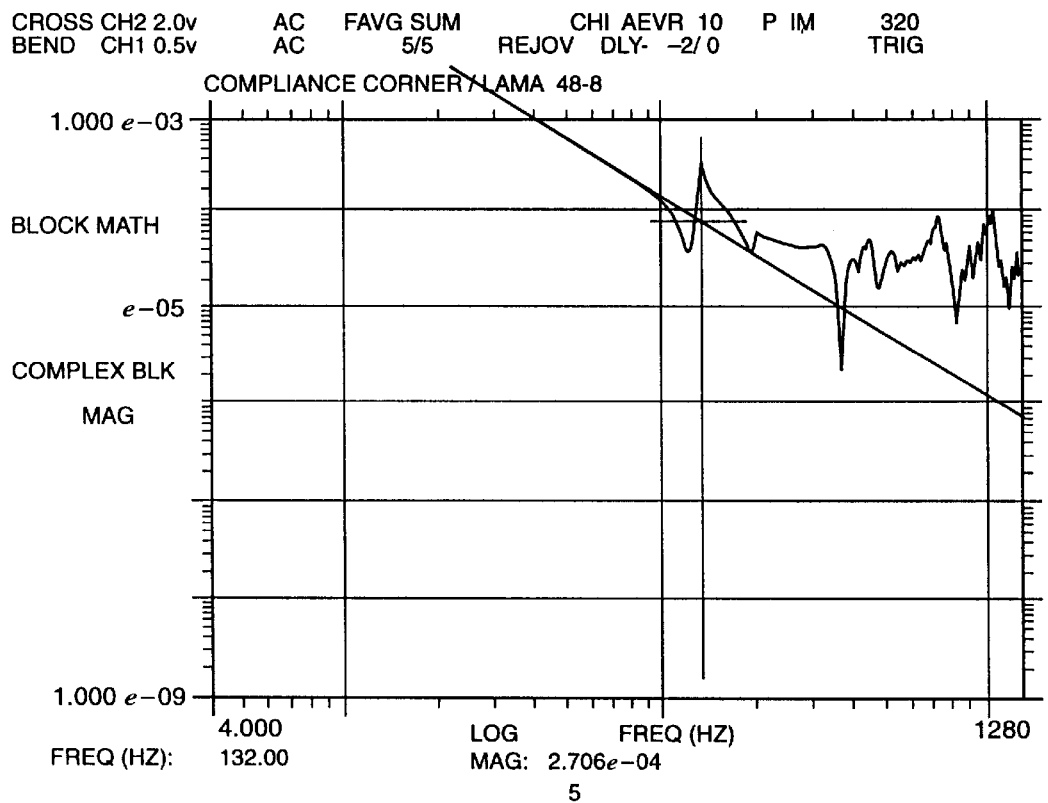
FIG. 9 is a graph showing the Q value of a corner of a platform made from the vibration dampening material of the present invention.
Figure 10:
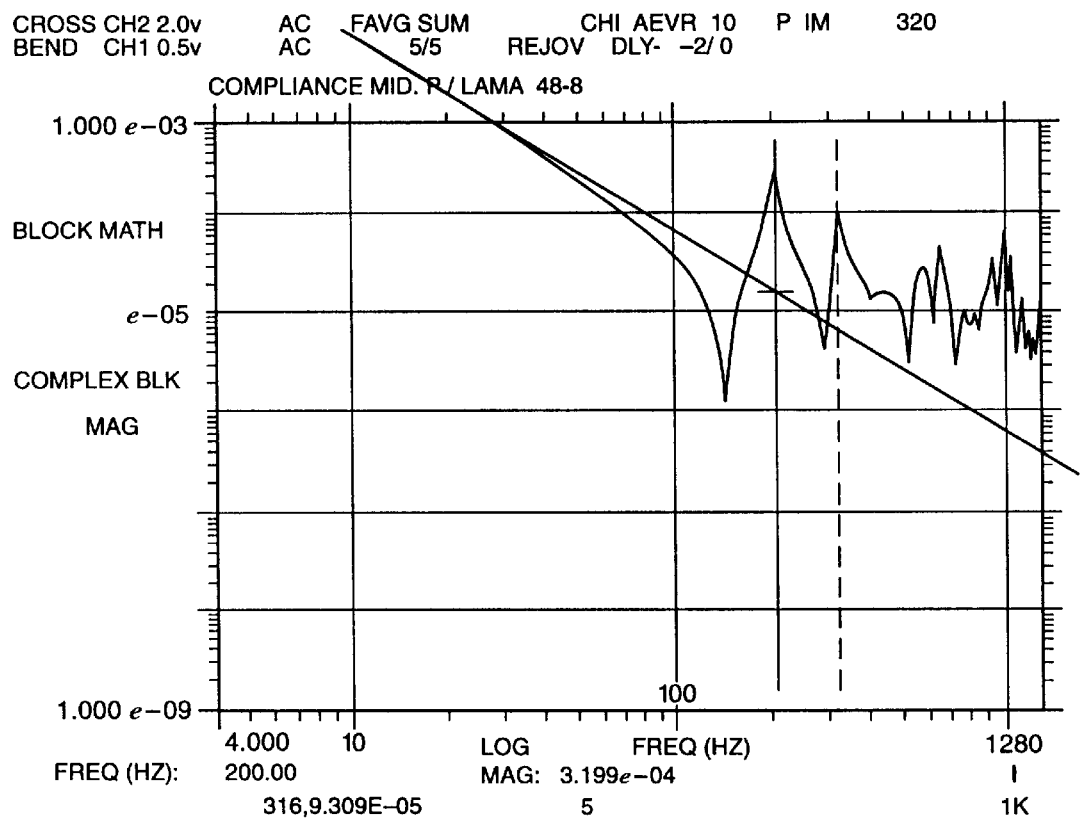
FIG. 10 is a graph showing the Q value of the midpoint of a platform made from the vibration dampening material of the present invention.

Further, it should be noted that the material 10 produced herein has a Q value in the range of 3–19 depending upon the materials used and the section of the material tested. The Q value is the reference value for maximum amplification at resonance. In many experiments, industrial uses, musical uses, dampening of table top resonance modes is critical for maximum stability. The goal is to design a table top whose compliance curve deviates as little as possible from the theoretical ideal rigid body line. FIGS. 9 and 10 are graphs illustrating the Q value and compliance curve of the material 10 shown in FIG. 3 of the present invention. The straight line is the theoretical ideal rigid body line. Absolute compliance values that are compared to the the Ideal Rigid Body provide a good indication of the dampening ability of a material.

Maximum amplification at resonance, or Q, is a measure of how much the compliance curve deviates from the ideal rigid body line. In exact terms, it is defined as the maximum compliance value of the highest peak above the ideal rigid body line (usually but not always the first peak on the left) divided by the ideal rigid body response at the same frequency. The lower the Q a structure has, the more stable the structure will be. Examples of Q values for known structures are Q=4 for a steel honeycomb core, Q=12 for an aluminum honeycomb core, and Q=460 for a block of granite; these pieces being two inches thick and having stainless steel skins.

The present material 10 has a Q value of 18.8 at its midpoint and 3.39 at its corners as shown in FIGS. 9 and 10. This data indicates that the material 10 has 25 times the dampening characteristics of granite but somewhat lower dampening characteristics than steel or aluminum honeycomb structures described herein. However, steel and aluminum structures cost approximately 3 to 6 times as much as a platform made from the material 10. For example, an aluminum honeycomb core structure costs approximately $2500.00 but a platform of my material costs approximately $375.00.

Furthermore, the material 10 specifically disclosed herein was designed for optimal acoustic performance and could easily be modified by perforating the core material or by using a lighter core section and thus increase the stiffness to weight ratio, resulting in a lower Q measurement. Accordingly, it is anticipated by the inventor that modification to the material disclosed herein will improve its Q value.

Additionally, referring now to FIGS. 1 and 4–6, cones 50 made of a core material 20 like M-103 bulk molding material available from Industrial Dielectrics, Inc. may be used to further dampen the vibrations of a component. The cones 50, or other support structures or chassis made of this material will in and of themselves will dampen unwanted vibrations without use of a platform made from the material 10, but not as effectively.

The cones 50, or any other desired structural form, are made by known injection molding and/or compression molding techniques. However, the use of this material as a sound or vibration dampening material is believed to be previously unknown and certainly not known for use in a chassis structure or a support structure like the cones 50.

Cones 50 made from the material 20 preferably should have as flat a top surface 52 as possible and may easily be made with an opening 54 having threads 56 so that they can be coupled if desired to a component or platform.

The foregoing is considered as illustrative only of the principles of the invention. Furthermore, since numerous modifications and changes will readily occur to those skilled in the art, it is not desired to limit the invention to the exact construction and operation shown and described. While the preferred embodiment has been described, the details may be changed without departing from the invention, which is defined by the claims.

What is claimed is:

1. A vibration dampening material comprising a layer of a generally rigid core material and at least one layer of a woven high modulus material, the core material being directly coupled to the woven high modulus material.

2. The vibration dampening material of claim 1 wherein the core material is substantially 0.5 inches thick.

3. The vibration dampening material of claim 1 further including a cover material fastened to the high modulus material.

4. The vibration dampening material of claim 1 wherein the core material is sandwiched between at least two layers of high modulus material.

5. The vibration dampening material of claim 1 wherein the high modulus material is impregnated with a resin.

6. The vibration dampening material of claim 1 wherein the core material comprises a bulk molding compound.

7. The vibration dampening material of claim 1 wherein the high modulus material includes at least one material selected from the group consisting of carbon fiber, fiberglass, aramid fibers, metals fibers, silicon carbide fiber, alumina fiber, highly orientated polyethylene fiber, quartz fibers, and ceramic fibers.

8. The vibration dampening material of claim 1 wherein the core material includes at least one material selected from the group consisting of carbon fiber, aramid fiber, glass fiber, alumina fiber, quartz fiber, silicon carbide fiber, highly orientated polyethylene fiber, polyester fibers, metal, ceramic, glass, and stone.

9. The vibration dampening material of claim 3 wherein the cover material is a material selected from the group consisting of acrylic, plastic, resins, metal, glass, or stone.

10. The vibration dampening material of claim 5 wherein the resin is a material selected from the group consisting of polyester, epoxy, phenol resins, diallylphthalate resins, polymide resins, and cyanate resins.

11. The vibration dampening material of claim 5 wherein the resin is activated by a catalyst.

12. The vibration dampening material of claim 1 having a Q value in the range of 3–19.

13. A method of dampening vibrations comprising placing a material, comprising a layer of a generally rigid core material and at least one layer of a woven high modulus material, the core material being fastened directly to the woven high modulus material, in position for dampening vibrations originating from at least one vibration source.

14. The method of claim 13 wherein the core material is substantially 0.5 inches thick.

15. The method of claim 13 wherein the vibration dampening material further includes a cover material fastened to the high modulus material.

16. The method of claim 13 wherein the core material is sandwiched between at least two layers of high modulus material.

17. The method of claim 13 wherein the high modulus material is impregnated with a resin.

18. The method of claim 13 wherein the core material comprises a bulk molding compound.

19. The method of claim 13 wherein the high modulus material includes at least one material selected from the group consisting of carbon fiber, fiberglass, aramid fibers, metals fibers, silicon carbide fiber, alumina fiber, highly orientated polyethylene fiber, quartz fibers, polyester, and ceramic fibers.

20. The method of claim 13 wherein the core material includes at least one material selected from the group consisting of carbon fiber, aramid fiber, glass fiber, alumina fiber, quartz fiber, silicon carbide fiber, highly orientated polyethylene fiber, metal, ceramic, glass, and stone.

21. The method of claim 15 wherein the cover material is a material selected from the group consisting of acrylic, metal, plastic, glass, or stone.

22. The method of claim 17 wherein the resin is a material selected from the group consisting of polyester, epoxy, phenol resins, diallylphthalate resins, polymide resins, and cyanate resins.

23. The method of claim 17 wherein the resin is activated by a catalyst.

24. The method of claim 1 wherein the vibration dampening material has a Q value of 3–19.

* * * * *